(12) United States Patent
Anderson et al.

(10) Patent No.: US 9,742,360 B2
(45) Date of Patent: Aug. 22, 2017

(54) EFFICIENT SMART WIDEBAND LINEAR HYBRID CMOS RF POWER AMPLIFIER

(71) Applicant: DSP Group Ltd., Herzelia (IL)

(72) Inventors: Sergey Anderson, Netanya (IL); Udi Suissa, Ra'anana (IL)

(73) Assignee: DSP GROUP LTD., Herzliya (IL)

( * ) Notice: Subject to any disclaimer, the term of this patent is extended or adjusted under 35 U.S.C. 154(b) by 0 days.

(21) Appl. No.: 15/075,730

(22) Filed: Mar. 21, 2016

(65) Prior Publication Data

US 2016/0276986 A1    Sep. 22, 2016

Related U.S. Application Data

(60) Provisional application No. 62/136,551, filed on Mar. 22, 2015.

(51) Int. Cl.
*H03F 1/32* (2006.01)
*H03F 3/193* (2006.01)
(Continued)

(52) U.S. Cl.
CPC .......... *H03F 1/3294* (2013.01); *H03F 3/193* (2013.01); *H03F 3/245* (2013.01);
(Continued)

(58) Field of Classification Search
CPC .......................... H03F 1/3294; H04L 27/2623
(Continued)

(56) References Cited

U.S. PATENT DOCUMENTS 4,516,080 A * 5/1985 Garde ................. H03F 1/3223
330/151
4,773,096 A * 9/1988 Kirn ..................... H03F 3/082
330/10

(Continued)

OTHER PUBLICATIONS

Lu, C. et al., "A 24.7dBm All-Digital RF Transmitter for Multimode Broadband Applications in 40nm CMOS", IEEE J. Solid-State Circ., ISSCC 2013, Session 19, pp. 332-334, 2013.
(Continued)

*Primary Examiner* — Patricia T Nguyen
(74) *Attorney, Agent, or Firm* — Reches Patents

(57) ABSTRACT

A novel and useful linear, efficient, smart wideband CMOS hybrid power amplifier that combined an analog linear amplification path and a digital power amplification (DPA) path. PA path control logic analyzes the input I and Q signals and determines which amplification paths to steer the input I and Q signals to. The analog linear amplification path comprises digital to analog converters for both I and Q paths and one or more analog linear power amplifiers. The digital power amplification path comprises I and Q up-sampling circuits and I and Q RF DAC circuits (e.g., digital PA circuits). In operation, the PA path control logic compares the I and Q signals to thresholds (which may or may not be different) and based on the comparisons, selects one or more paths for the input I and Q signals. Whether the signals from the analog and digital amplification paths are to be combined or selected (i.e. switched), the PA path control circuit is operative to generate select (switch) control signals which are applied to summer/selector elements which generate the output of the hybrid PA.

22 Claims, 14 Drawing Sheets

(51) Int. Cl.
*H04L 27/26* (2006.01)
*H03F 3/24* (2006.01)
*H03F 3/45* (2006.01)

(52) U.S. Cl.
CPC ..... *H03F 3/45188* (2013.01); *H04L 27/2623* (2013.01); *H03F 2200/336* (2013.01); *H03F 2200/451* (2013.01); *H03F 2201/3215* (2013.01)

(58) Field of Classification Search
USPC ........................................ 330/295, 124 R, 53
See application file for complete search history.

(56) References Cited

U.S. PATENT DOCUMENTS

| | | | |
|---|---|---|---|
| 5,115,203 A | 5/1992 | Krett et al. | |
| 7,978,009 B2 | 7/2011 | Mu | |
| 2002/0084811 A1* | 7/2002 | Casier | H03F 1/3229 327/108 |
| 2003/0222713 A1* | 12/2003 | Skinner | H03F 3/2173 330/251 |
| 2004/0095190 A1* | 5/2004 | Klaren | H03F 3/602 330/124 R |
| 2004/0263246 A1* | 12/2004 | Robinson | H03F 1/0244 330/124 R |
| 2008/0265996 A1* | 10/2008 | Kim | H03F 1/3247 330/291 |
| 2013/0093511 A1* | 4/2013 | Baek | H03F 3/602 330/124 R |
| 2013/0194037 A1* | 8/2013 | Takahashi | H03F 1/32 330/3 |

OTHER PUBLICATIONS

Hu, S. et al., "A Broadband CMOS Digital Power Amplifier with Hybrid Class-G Doherty Efficiency Enhancement", ISSCC 2015, Session 2, pp. 44-46, 2015.

Wang, H. et al., "A Highly-Efficient Multi-Band Multi-Mode Digital Quadrature Transmitter with 2D Pre-Distortion", ISCAS 2013, pp. 501-504, May 2013.

* cited by examiner

US 9,742,360 B2

EFFICIENT SMART WIDEBAND LINEAR HYBRID CMOS RF POWER AMPLIFIER

REFERENCE TO PRIORITY APPLICATION

This application claims priority to U.S. Provisional Application Ser. No. 62/136,551, filed Mar. 22, 2015, entitled "Hybrid Amplification Device," incorporated herein by reference in its entirety.

FIELD OF THE INVENTION

The present invention relates generally to amplifier circuits and in particular to a linear, efficient, smart wideband hybrid CMOS radio frequency (RF) power amplifier (PA) that incorporates a linear analog amplification path as well as a digital amplification path.

BACKGROUND OF THE INVENTION

In recent years more and more modern wireless standards are based on Orthogonal Frequency Division Multiplexing (OFDM) modulation. In OFDM, the sub-carrier frequencies are chosen so that the sub-carriers are orthogonal to each other, meaning that cross-talk between the sub-channels is eliminated and inter-carrier guard bands are not required. The orthogonality allows for high spectral efficiency, robustness against narrow-band co-channel interference and robustness against intersymbol interference (ISI) and fading caused by multipath propagation.

Example standards based on OFDM modulation include Wireless LAN (WLAN) 802.11a/g/n/ac/ah, 3GPP Long Term Evolution (LTE), Data Over Cable Service Interface Specification (DOCSIS), Digital Video Broadcasting (DVB), Ultra-Wideband (UWB), mobile WiMAX, Power Line Carrier (PLC), etc.

Several disadvantages of OFDM modulation include sensitivity to Doppler shift which limits its use in high speed vehicles, sensitivity to frequency synchronization problems and high peak-to-average-power ratio (PAPR). The high PAPR requirement is a major problem in transceiver design that requires the use of very linear transmitter circuitry, especially so for the RF power amplifier circuitry.

One simple solution to operating the power amplifier circuit in a linear mode with large PAPR is to transmit less power and thus avoid compression. This technique is known as Back-Off (BOF). In this case, however, there is a very dramatic drop in efficiency. FIGS. 7A and 8 illustrate the relationship between linearity, efficiency and output power. Furthermore, output power becomes very limited such as in the case where an output average power requirement of 20 dBm dictates saturation power levels of 34 to 38 dBm. Various other prior art power amplifiers provide different solutions for amplifying OFDM signals but all of them are sub-optimal.

There is thus a growing need to provide an optimal power amplifier that is (1) wideband, (2) highly linear and (3) highly efficient in its operation.

SUMMARY OF THE INVENTION

The present invention is a linear, efficient, smart wideband CMOS hybrid power amplifier. The hybrid PA circuit includes an analog linear amplification path and digital amplification path. PA path control logic analyzes the input I and Q signals and determines which amplification path(s) to steer the input I and Q signals to. The analog amplification path comprises digital to analog converters for both I and Q paths and one or more analog linear power amplifiers. The digital amplification path comprises I and Q up-sampling circuits and I and Q RF DAC circuits (e.g., digital PA circuits).

In operation, the PA path control logic compares the I and Q signals to thresholds (which may or may not be different) and based on the comparisons, selects one or more paths for the input I and Q signals. Whether the signals from the analog or digital amplification paths are to be combined or selected (i.e. switched), the PA path control circuit is operative to generate select (switch) control signals which are applied to summer/selector elements which generate the output of the hybrid PA.

There is thus provided in accordance with the present invention, a hybrid power amplifier (PA) circuit, comprising a first amplification path based on an analog linear amplifier and operative to receive and amplify an input signal, a second amplification path based on a digital power amplifier (DPA) and operative to receive and amplify the input signal, a path control circuit operative to select at least one of the first amplification path and the second amplification path in response to the input signal, and a circuit operative to either combine or select an output of the first amplification path and the second amplification path to generate a linear hybrid PA output signal therefrom.

There is also provided in accordance with the present invention, a hybrid power amplifier (PA) circuit, comprising a first amplification path based on an analog linear amplifier and operative to receive and amplify an input I signal, a second amplification path based on an analog linear amplifier and operative to receive and amplify an input Q signal, a third amplification path based on a digital power amplifier (DPA) and operative to receive and amplify the input I signal, a fourth amplification path based on a digital power amplifier (DPA) and operative to receive and amplify the input Q signal, a path control circuit operative to select at least one of the first amplification path and the second amplification path for the input I signal, and to select at least one of the third amplification path and the fourth amplification path for the input Q signal, a first circuit operative to either combine or select an output of the first amplification path with an output of the second amplification path, a second circuit operative to either combine or select an output of the third amplification path with an output of the fourth amplification path, and a third circuit operative to combine outputs from the first circuit and the second circuit to generate a hybrid PA output signal therefrom.

There is further provided in accordance with the present invention, a method of amplifying an I and Q input signal, the method comprising providing an I analog linear amplification path operative to receive and amplify an I portion of an input I and Q signal, providing an I digital power amplification (DPA) path operative to receive and amplify an I portion of the input I and Q signal, providing a Q analog linear amplification path operative to receive and amplify an I portion of an input I and Q signal, providing a Q digital power amplification (DPA) path operative to receive and amplify an I portion of an input I and Q signal, first comparing the input I signal to a first threshold, second comparing the input Q signal to a second threshold, selecting one or more of the I analog linear amplification, the I digital power amplification path, the Q analog linear amplification and the Q digital power amplification path in accordance with the first comparing and the second comparing, and combining and/or selecting outputs of the the I analog linear amplification, the I digital power amplification path, the Q analog linear amplification and the Q digital power amplification path in accordance with the first comparing and the second comparing to generate a hybrid power amplifier (PA) output signal therefrom.

BRIEF DESCRIPTION OF THE DRAWINGS

The invention is herein described, by way of example only, with reference to the accompanying drawings, wherein.

DETAILED DESCRIPTION OF THE INVENTION

Figure 1:
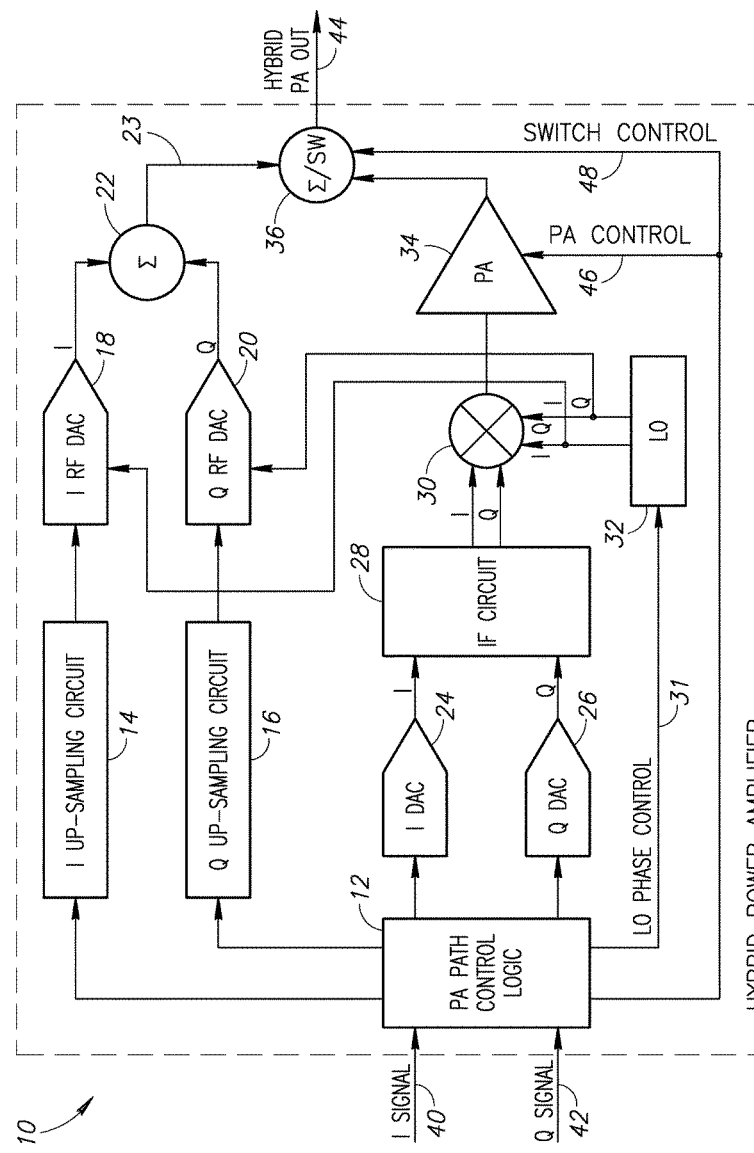
FIG. 1 is a schematic diagram illustrating a first example linear hybrid power amplifier circuit of the present invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

A schematic diagram illustrating a first example linear hybrid power amplifier circuit of the present invention is shown in FIG. 1. The hybrid PA circuit, generally referenced 10, comprises a linear analog amplification path and a digital amplification path. The PA path control logic block 12 analyzes the input I signal 40 and Q signal 42 and determines which amplification paths to steer the input I and Q signals to. The analog amplification path comprises I digital to analog converter (DAC) 24, Q DAC 26, IF circuit 28, mixer 30, local oscillator (LO) 32 and analog linear power amplifier 34. The PA 34 is controlled via PA control signal 46 from the PA path control circuit 12. The digital amplification path comprises I up-sampling circuit 14, Q up-sampling circuit 16, I RF DAC 18, Q RF DAC 20 and summer 22 for adding the outputs of the I and Q RF DACs. LO phase control 31 is input to the LO 32 from the PA path control logic block 12.

In operation, the PA path control logic compares the I and Q signals to thresholds (which may or may not be different) and based on the comparisons, select one or more paths for the input I and Q signals. Whether the signals from the analog and digital amplification paths are to be combined or selected (i.e. switched), the PA path control circuit is operative to generate the select (switch) control signal 48 which is applied to summer/selector 36. The output of the summer/selector 36 constitutes the output 44 of the hybrid PA.

The I up-sampling circuit 14 is configured to receive the I signal from the path controller 12, resample it to a much higher clock and pass it to the I RF DAC 18. The I RF DAC 18 is also fed a local oscillator signal from local oscillator (LO) 32. The Q up-sampling circuit 16 is configured to receive the Q signal from the path controller 12, resample it to a much higher clock and pass it to I RF DAC 20. The Q RF DAC 20 is also fed a local oscillator signal from local oscillator 32.

The I RF DAC 18 and the Q RF DAC 20 output I and Q amplified signals, respectively. Summer 22 functions to add the I and Q amplified signals from I RF DAC 18 and Q RF DAC 20 to provide an output signal 23 from the digital amplification path. Note that preferably, the RF DACs have a switching response that is fast enough to handle the fast rise and fall times of the signal spikes, especially for wideband signals.

Note that I RF DAC 18 and Q RF DAC 20 may be implemented as class C, D, E, F power amplifiers as well as all other well-known classes and variations suitable for use with the digital class of the power amplifiers. The RF DACs are operated using a binary/unary/mixed weight effective to turn on and off relevant PAs in accordance with the digital word.

In one embodiment, the digital amplification path comprises an output harmonic rejection filter or fundamental frequency pass band filter or employs some other well-known harmonic reduction technique in order to reduce the harmonic impact to the hybrid PA output signal and increase the linearity of the hybrid PA.

In addition, the hybrid PA includes a 2D digital predistortion circuit to compensate for mismatches between the I and Q paths and impairments within the I path and the Q path. The predistortion algorithm is used to compensate for RF DAC impairments and may be a part of the controller 12.

Note that since the hybrid amplification digital device is used to amplify (and hence digitize) only spikes which are relatively rare (<10% of time, depending on the threshold set) and can be quantized in a rough manner. In this case, the 2D predistortion algorithm may be less complex and less strict relative to a fully digital transmitter where each LSB is important.

It is also noted that the hybrid amplification circuit may successfully replace and outperform pure analog power amplifiers and pure digital power amplifiers. The latter use a very large number of power RF DACs (13-bits for each of I and Q, for example) and very complex digital predistortion algorithms for their implementation.

The analog amplification path includes I DAC 24, Q DAC 26, intermediate frequency (IF) circuit 28, mixer 30, and analog power amplifier 34. The output of analog power amplifier 34 is also connected to an input of output circuit 36. The analog power amplifier can be based on Class A/A-B/B, Doherty etc. Such classes of analog power amplifiers allow operating an analog power amplifier with low AM2AM and AM2PM distortions at targeted output power (without digital pre-distortion).

In one embodiment, the analog amplification path includes output harmonic rejection filter/fundamental frequency pass band filter or other harmonic reduction techniques in order to reduce the harmonic's impact to the PA output signal and increase the linearity of the PA.

IF circuit 28 may comprise, for example, an I branch and a Q branch, wherein each of the I and Q branches may include a filter (e.g., such as a low pass filter or a bandpass filter) and a gain/attenuation circuit.

When only one of the amplification paths is selected (i.e. analog or digital) for amplifying both the I and Q signals, the output circuit 36 acts as a switch and selects to output only the output signal of that amplification path.

The output circuit 36 can be realized using different combining techniques utilizing either magnetic or electrical coupling of the radio frequency (RF) signals. When both amplification paths are selected (e.g., the analog amplification path for amplifying the I signal and the digital amplification path for amplifying the Q signal) then the output circuit 92 acts as an adder and adds the output signals from both paths.

In one embodiment, the invention comprises a hybrid amplification circuit that includes (1) a digital amplification path, (2) an analog amplification path, and a (3) path controller operative to (a) determine when to apply digital amplification, (b) when to apply analog amplification, (c) when to apply both digital and analog amplification and (d) to control the amplification process. In another embodiment, the hybrid amplification circuit includes application of two dimensional (2D) digital pre-distortion algorithm to correct for FQ mismatches.

In operation, the hybrid amplification device receives multiple input signals (e.g., I and Q signals). The input I and Q signals are compared to I and Q thresholds, respectively, and based thereon the circuit applies linear analog amplification on the I signal, the Q input signal, neither signal or both signals; and applies digital amplification on the I signal, Q signal, neither signal or both signals.

The example topology of FIG. 1 comprises two RF DACs and one linear PA. There are two configuration options for this topology as defined below. Note that in both configurations, the Vth for I and Q signal may or may not be the same.

Configuration 1:

State 1: If both I and Q baseband signals are below the threshold voltage Vth, then both I and Q RF DACs 18, 20 are switched off and only linear PA 34 is active.

State 2: If both I and Q baseband signals are above Vth, then both I and Q RF DACs are switched on and the linear PA is also active.

State 3: If the Q baseband signal is above Vth and the I baseband signal is below Vth, then the Q RF DAC is switched on and the I RF DAC is switched off and the linear PA is active as well.

State 4: If the I baseband signal is above Vth and the Q baseband signal is below Vth, then the I RF DAC is switched on and the Q RF DAC is switched off and the linear PA continues to be active.

Thus, in configuration 1 above, the linear PA 34 is always active. A second configuration is defined below.

Configuration 2:

State 1: If both I and Q baseband signals are below Vth, then both I and Q RF DACs 18, 20 are switched off and only linear PA 34 is active.

State 2: If both I and Q baseband signals are above Vth, then both I and Q RF DACs are switched on, the linear PA is switched off and summer/selector 36 is configured to output the signal from the RF combiner 22 to the output.

State 3: If the Q baseband signal is above Vth and the I baseband signal is below Vth, then the Q RF DAC is switched on and the I RF DAC is switched off and the linear PA is active.

State 4: If the I baseband signal is above Vth and the Q baseband signal is below Vth, then the I RF DAC is switched on and the Q RFDAC is switched off and the linear PA is active.

The analog amplification path is preferably optimized for low power levels while the digital amplification path is optimized for high power levels. This permits the hybrid amplification circuit to achieve a relatively very good error vector magnitude (EVM) floor and better efficiency along all range of power levels while requiring far fewer RF DAC components relative to a fully digital power amplifier. This results in substantially reduced complexity, robust EVM performance control, less area consumed by the RF DAC components while still providing flexibility and control.

Note that the EVM floor is optimized due to the linear performance of the analog amplification path at low power levels. The efficiency at low power levels (both average and instantaneous) is optimized since the analog power amplifier is configured for relatively low saturation power.

Similarly, the efficiency at high power levels (both average and instantaneous) is optimized due to the operation of RF power DACs in the digital amplification path which comprise digital power amplifier (DPA) circuitry which is operated selectively in accordance with the instantaneous digital word representing the required instantaneous power. This yields significantly higher efficiency and reduced power consumption.

With reference to FIG. 1, the path control logic 12 receives I and Q signals 40, 42, and determines an amplification scheme based upon one or more attributes of the I and Q signals. Note that a signal attribute may comprise the power level of a signal, an amplitude of a signal, a shape of an envelope of a signal, an absolute value of the power level of a signal, an absolute value of the amplitude of the signal, etc.

Several examples include: (1) the power level of the I signal is compared to a first threshold to determine how to amplify the I signal and/or the Q signal; (2) the power level of the Q signal is compared to a second threshold to determine how to amplify the I signal and/or the Q signal; and (3) a sum (or any other combination) of the power levels of the I and Q signals are compared to a third threshold to determine how to amplify the I and/or Q signals (i.e. which amplification paths to take for the I and Q signals).

A determination of how to amplify the I signal and/or the Q signal may include determining which path of the digital and analog amplification paths to use and determining amplification parameters such as gain, working point, etc.

Note that the first, second and third thresholds may be predetermined, dynamically adjusted or fixed. These thresholds may reflect the amplification characteristics of the different amplification paths. For example, these thresholds may be set in order to prevent the analog amplification path from amplifying signals that are strong enough to cause substantial distortions. In addition, the controller 12 may be configured to prevent too frequent switches between the analog and the digital amplification paths by the use of a hysteresis loop, for example.

Figure 2:
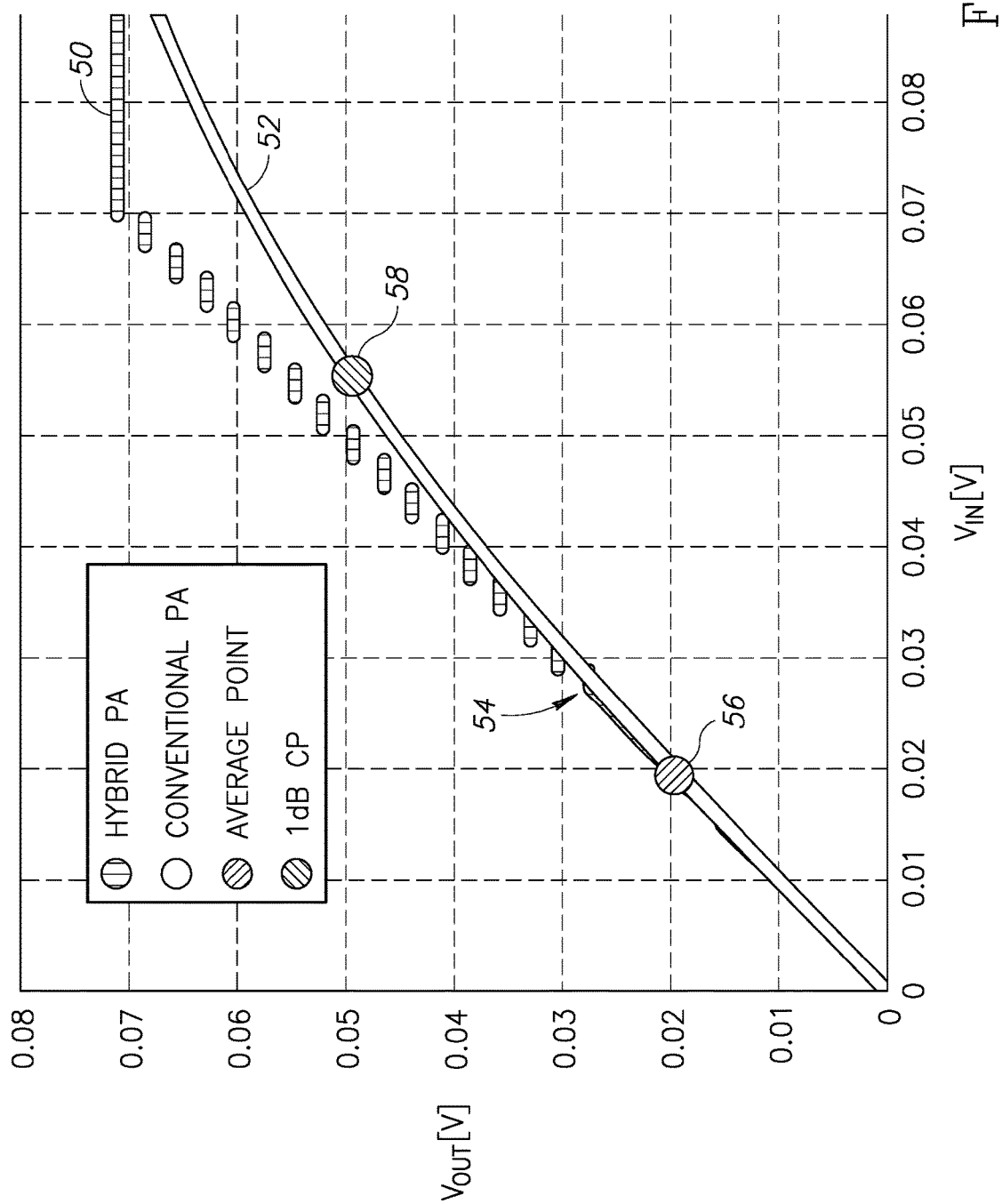
FIG. 2 is a graph illustrating Vout versus Vin for a conventional power amplifier and the power amplifier of the present invention having a first threshold.

A graph illustrating Vout versus Vin for a conventional power amplifier and the power amplifier of the present invention having a first threshold is shown in FIG. 2. Trace 52 represents a conventional PA, trace 50 represents the hybrid PA, dot 58 represents the 1 dB compression point of the conventional PA and dot 56 represents the average point. Arrow 54 points to the threshold in this example in which the hybrid PA selects the analog linear amplification path for Vin levels below the threshold and the digital amplification path for Vin levels above the threshold. Note that the digital amplification path comprises discrete levels resembling a staircase. In this example, the threshold is set above the average point 56.

Figure 3:
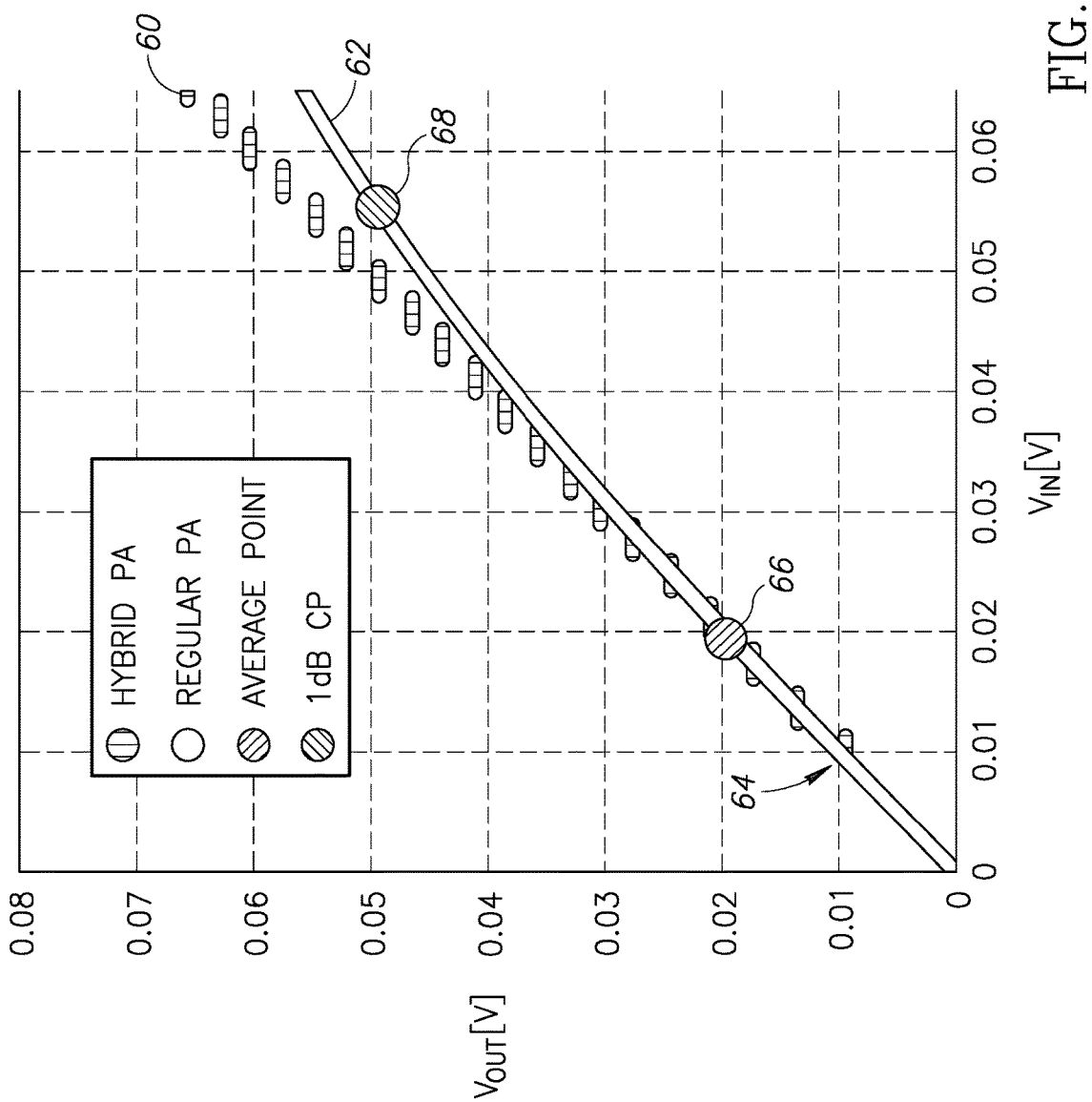
FIG. 3 is a graph illustrating Vout versus Vin for a conventional power amplifier and the power amplifier of the present invention having a second threshold.

A graph illustrating Vout versus Vin for a conventional power amplifier and the power amplifier of the present invention having a second threshold is shown in FIG. 3. Trace 62 represents a conventional PA, trace 60 represents the hybrid PA, dot 68 represents the 1 dB compression point of the conventional PA and dot 66 represents the average point. Arrow 64 points to the threshold in this example in which the hybrid PA selects the analog linear amplification path for Vin levels below the threshold and the digital amplification path for Vin levels above the threshold. Note that the digital amplification path comprises discrete levels resembling a staircase and that in this example, the threshold is set below the average point 66. Note also that the threshold in FIG. 3 is set lower than the that of FIG. 2.

Figure 4:
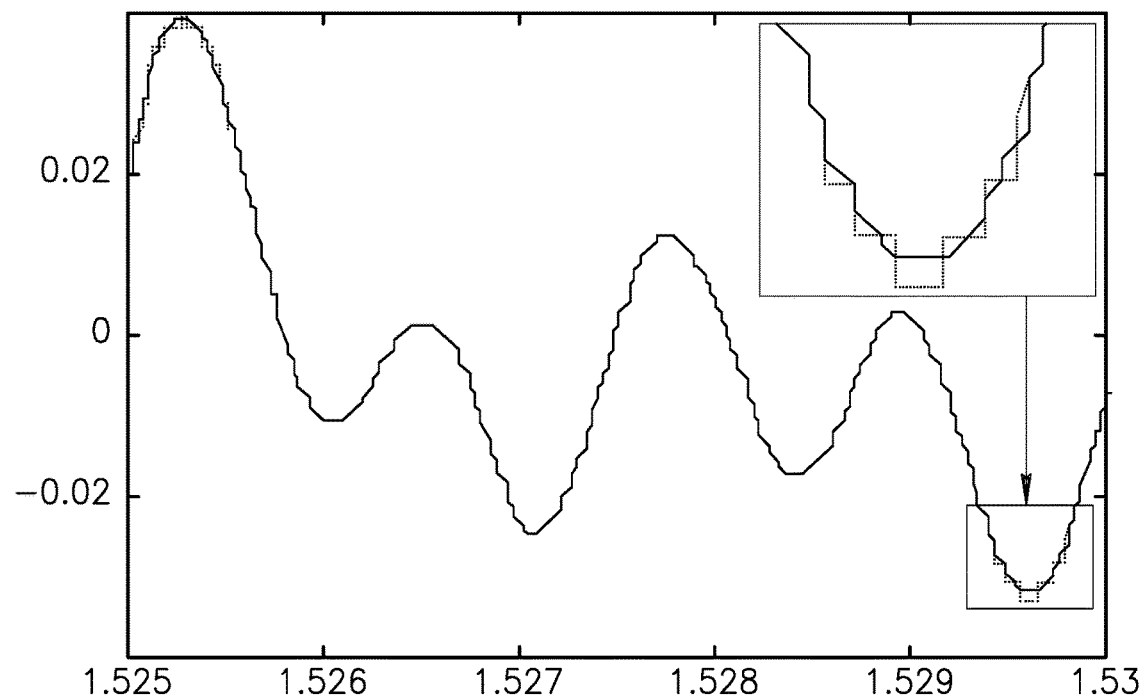
FIG. 4 is a graph illustrating an example Q signal before and after partial digitization.

A graph illustrating an example Q signal before and after partial digitization is shown in FIG. 4. In this example, the mean IQ level is 0.11 and the threshold is set to twice this value or 0.022. Thus, for Q values below 0.022, the linear analog amplification path is selected as shown in the solid trace. For Q values above 0.022, the digital amplification path is selected as shown by the dotted stair casing above +0.022 and below −0.022.

Figure 5:
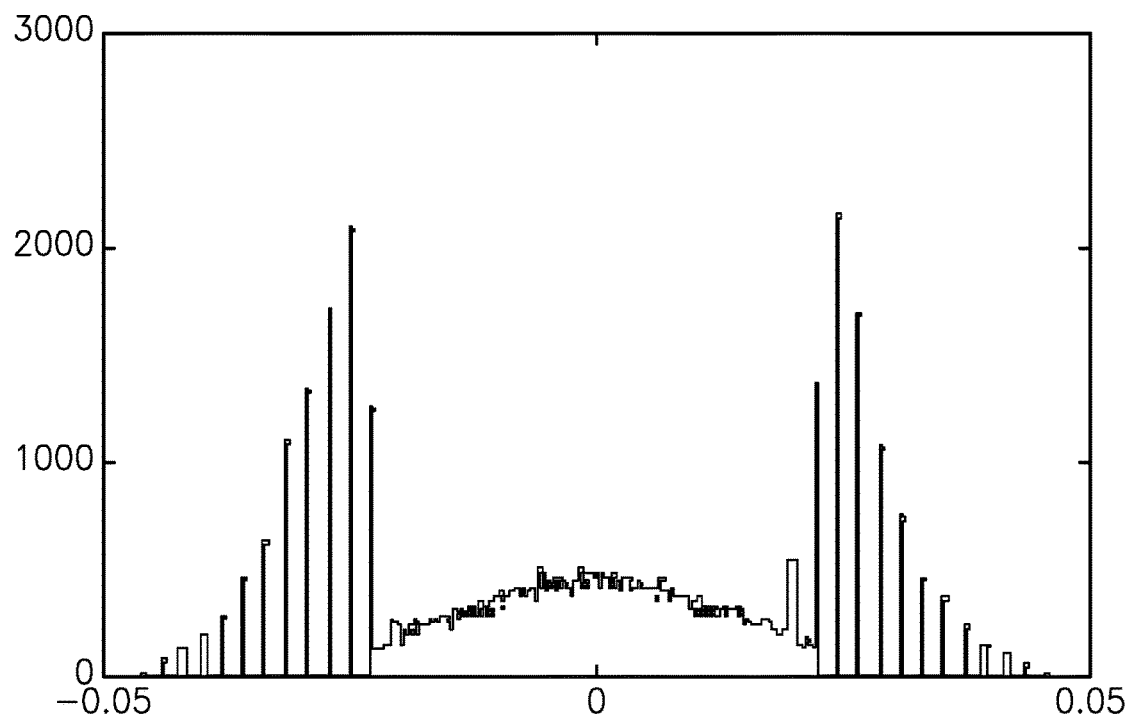
FIG. 5 is a graph illustrating an example histogram of the Q signal after partial digitization.

A graph illustrating an example histogram of the Q signal after partial digitization is shown in FIG. 5. The wide solid cluster from approximately −0.025 to +0.025 represents the Q values below the threshold and thus sent through the analog amplification path. The vertical lines from −0.025 to −0.050 and from +0.025 to +0.050 represent Q values above the threshold that were passed to the digital amplification path, hence the discrete stepped vertical lines.

Figure 6:
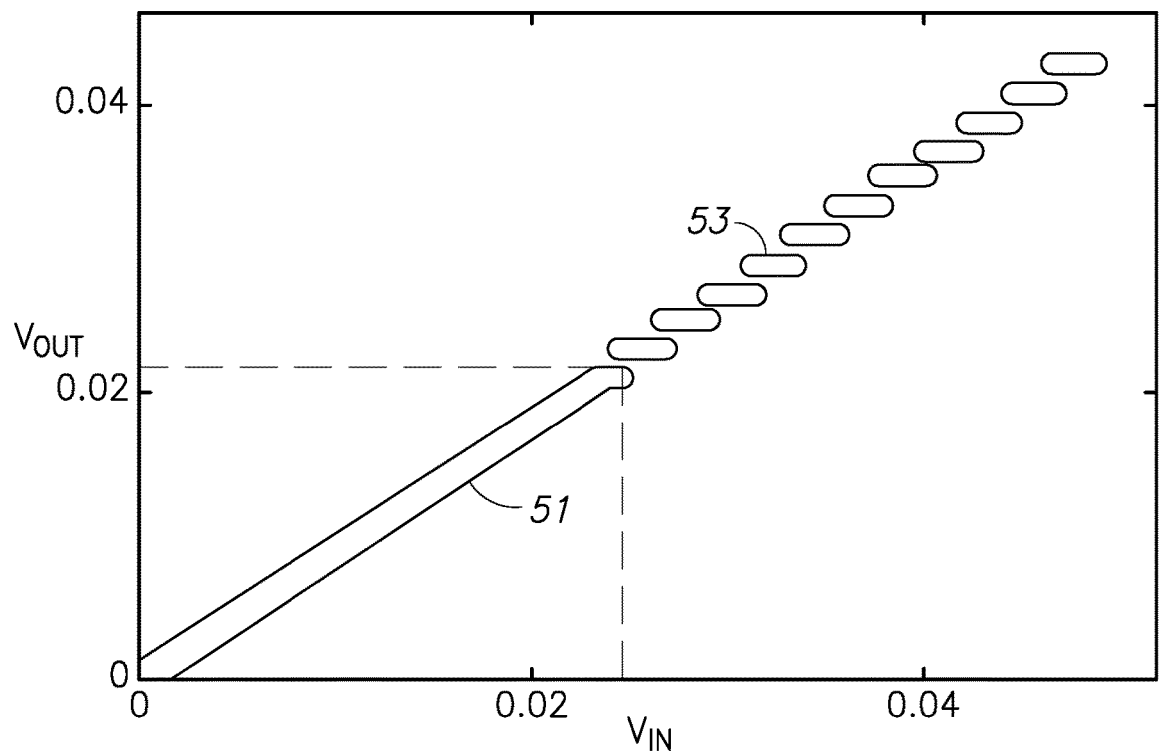
FIG. 6 is a graph illustrating Vout versus Vin for an example Q signal.

A graph illustrating Vout versus Vin for an example Q signal is shown in FIG. 6. In this example, the gain of the amplifier is one. Thus, Vin versus Vout is a straight line at a 45 degree angle. The output response in this case is a solid line 51 while Vin is less than the threshold which is 0.022. The response is solid because below the threshold, the linear analog amplification path is used. For Vin above the threshold, the response turns to discrete staircase because the digital amplification is used for input values above the threshold of 0.022.

Figure 7A:
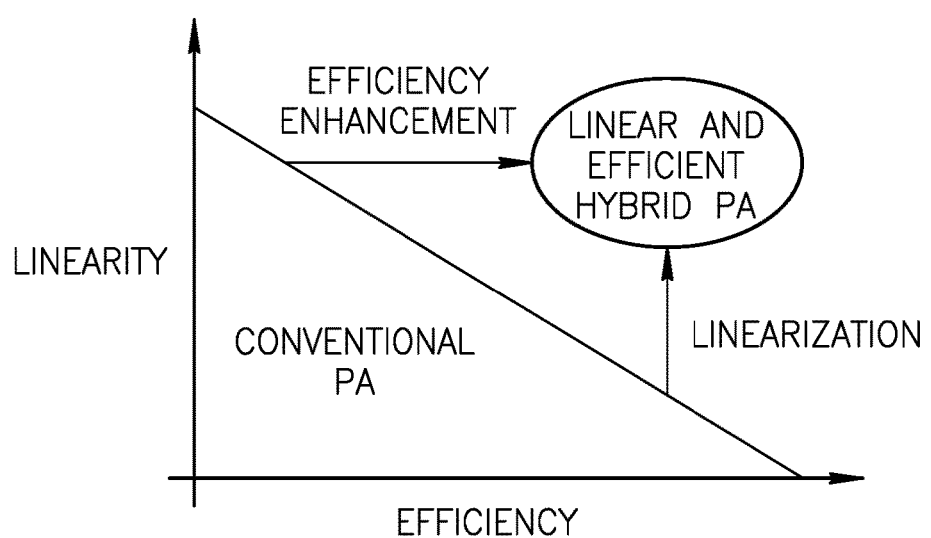
FIG. 7A is a graph illustrating linearity versus efficiency for a conventional PA and a PA constructed in accordance with the present invention.

A graph illustrating linearity versus efficiency for a conventional PA and a PA constructed in accordance with the present invention is shown in FIG. 7A. As indicated, with a conventional PA, linearity and efficiency are inversely related. The hybrid PA of the present invention, however, breaks this constraint and provides high linearity with high efficiency.

With reference to the digital amplification path, according to simulations performed by the inventors, 5-bits are sufficient to achieve satisfactory performance. The 5-bits represent 32 total levels including 16 levels for amplitude control of the RF DACs and a sign bit for the RF DACs' polarity control through the LO path. Note, however, that there is a tradeoff between the number of bits used in the digital path versus the threshold(s) used to determine which amplification path to take. This is illustrated in FIGS. 7A and 7B.

Figure 7B:
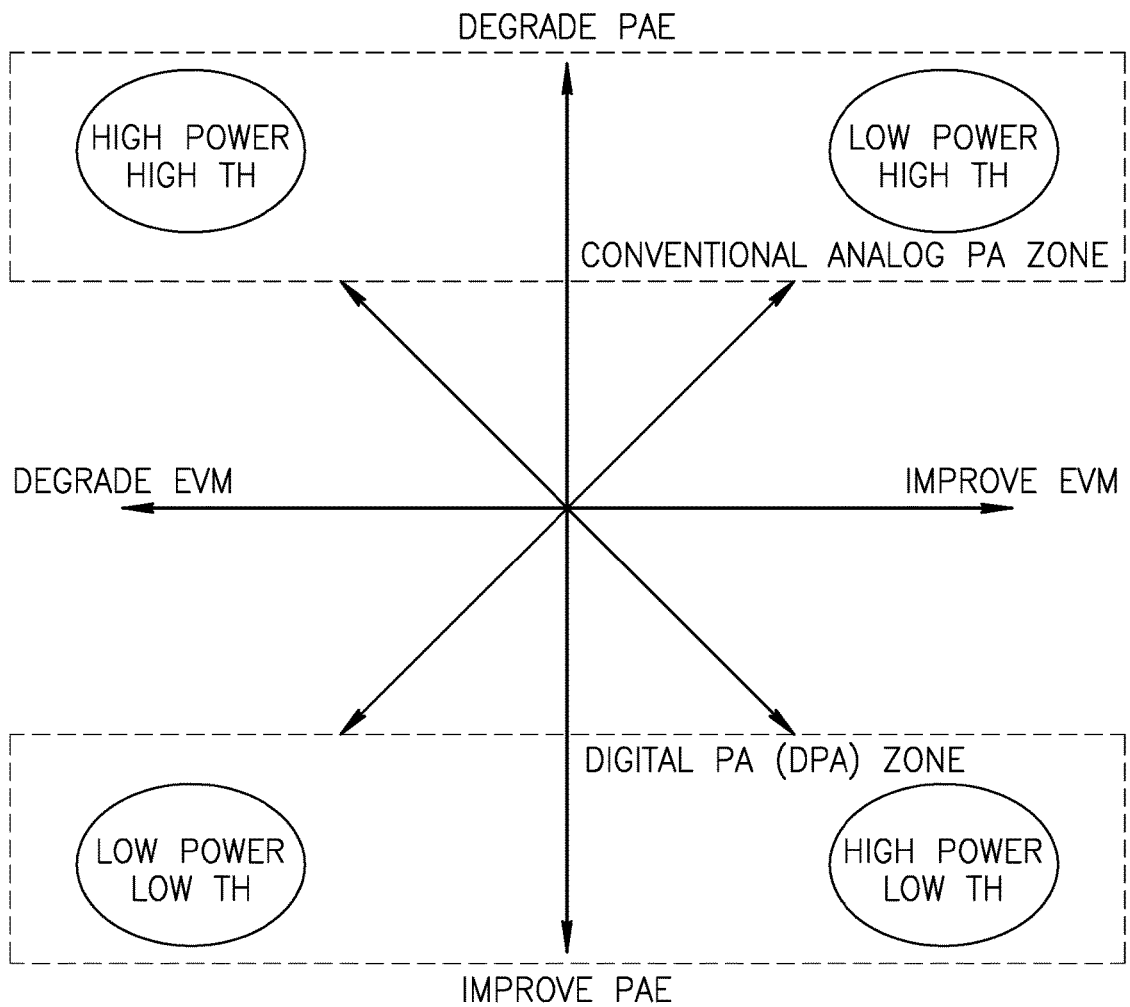
FIG. 7B is a graph illustrating the effect of the threshold of operation of the digital I and/or Q amplification paths given a particular number of quantization bits $N_b$ of the digital path RF DACs.

A graph illustrating the effect of the threshold of operation of the digital I and/or Q amplification paths given a particular number of quantization bits $N_b$ of the digital path RF DACs is shown in FIG. 7B. In this graph, the x-axis represents degradation or improvement in EVM while the y-axis represents degradation or improvement in power added efficiency (PAE). Given a fixed number of bits, specifically for low power levels, lowering the threshold improves efficiency but worsens EVM as lower and lower values of the input are amplified by the digital amplification path. On the other hand, increasing the threshold worsens efficiency but improves EVM as higher and higher values of the input are amplified by the linear analog amplification path. For high power levels, the behavior regarding EVM is opposite to that described supra.

Figure 7C:
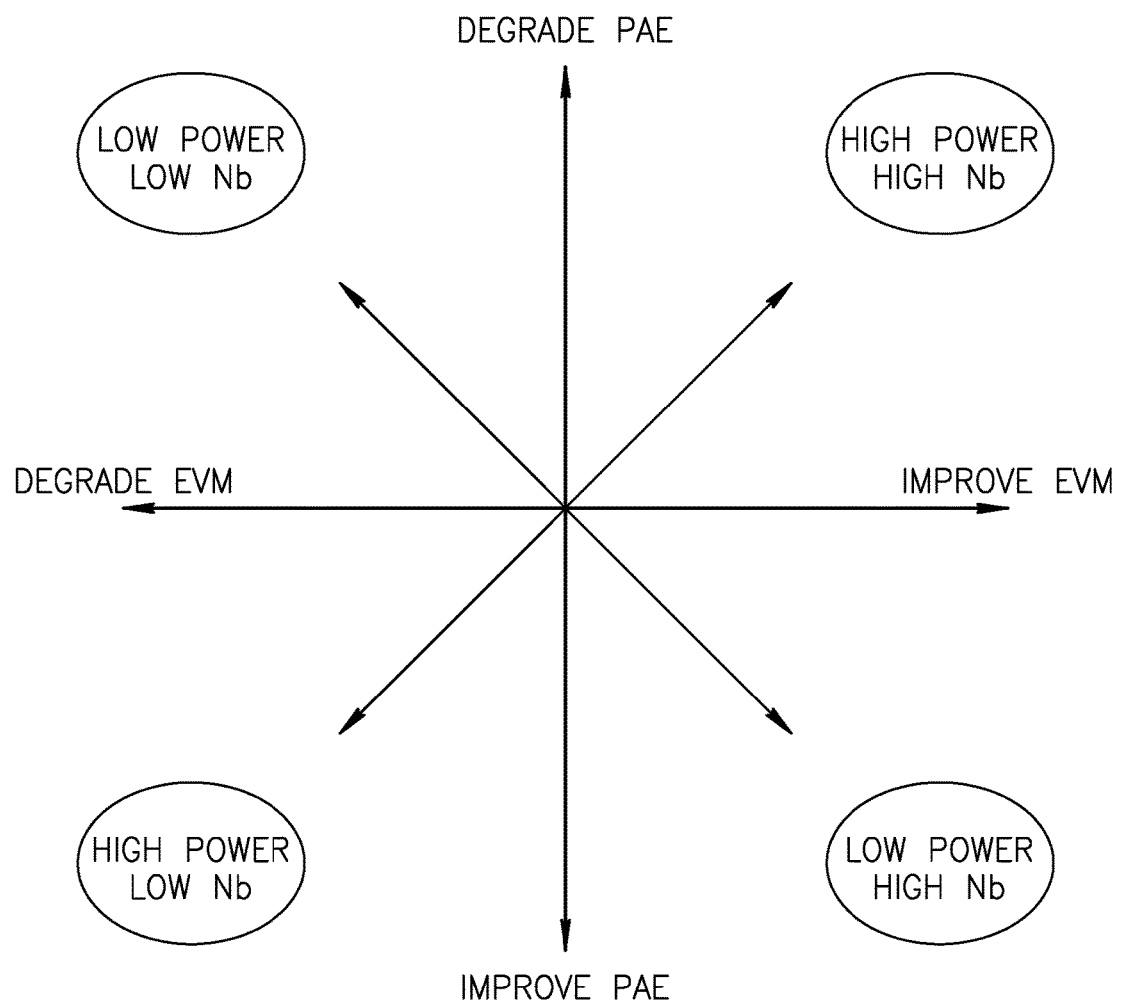
FIG. 7C is a graph illustrating the effect of the number of quantization bits $N_b$ of the digital path RF DACs given a particular threshold of operation of the digital I and/or Q amplification paths.

A graph illustrating the effect of the number of quantization bits $N_b$ of the digital path RF DACs given a particular threshold of operation of the digital I and/or Q amplification paths is shown in FIG. 7C. Similar to the graph in FIG. 7B, the x-axis represents degradation or improvement in EVM while the y-axis represents degradation or improvement in power added efficiency (PAE). Given a fixed threshold level, decreasing the number of bits used in the digital amplification path degrades EVM. Power added efficiency improvement or degradation depends on the power levels of the PA.

On the other hand, increasing the number of bits used in the digital amplification path improves EVM, improves efficiency for low power inputs and worsens efficiency for high power inputs.

Figure 8:
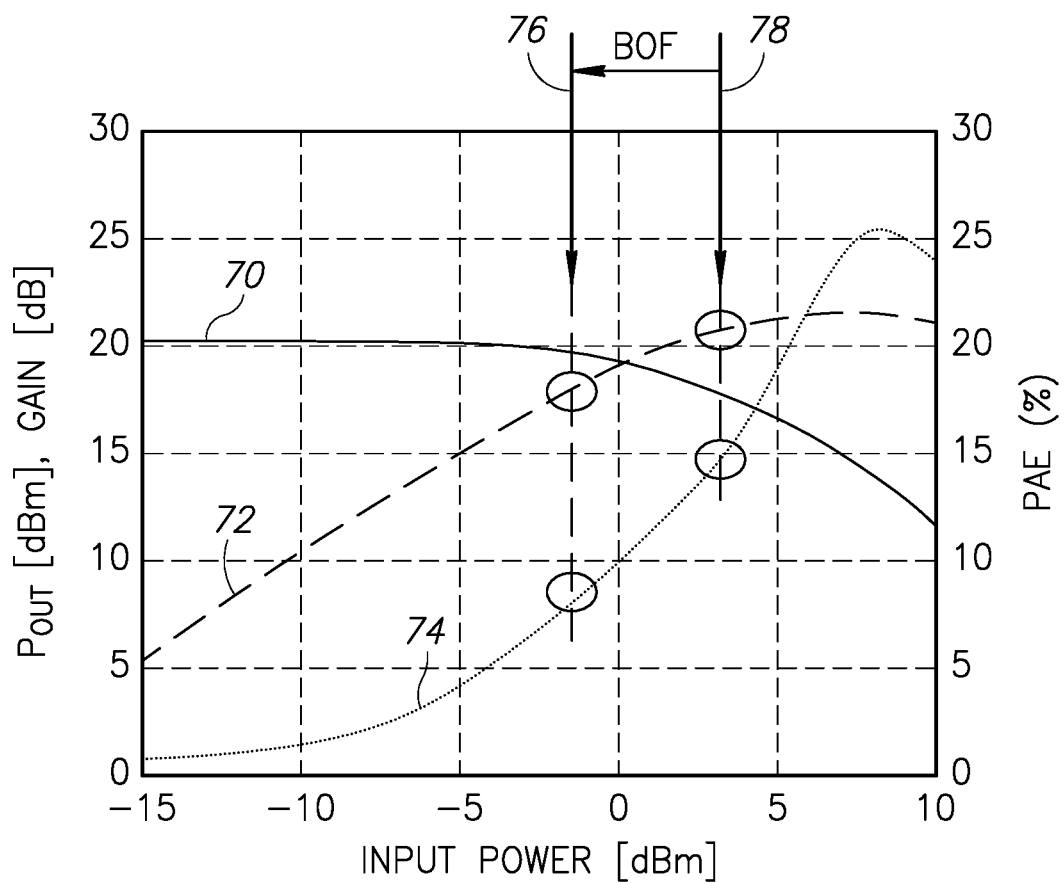
FIG. 8 is a graph illustrating output power Pout versus gain versus efficiency (PAE) as a function of input power.

A graph illustrating output power Pout versus gain versus efficiency (PAE) as a function of input power is shown in FIG. 8. In this example performance graph, solid trace 70 represents the amplification gain versus input power, dashed trace 72 represents output power versus input power, and dotted trace 74 represents efficiency versus input power. In a conventional system, backoff (for example from point 78 to point 76) may be used in order to handle modulation such as OFDM with the resultant increase in linearity but at the expense of efficiency.

Note that there are dependencies between (1) the threshold level (configurable relative to average), (2) the number of bits used in the digital amplification path, and (3) the saturation-to-average ratio which impacts the performance as well as the implementation of the analog power amplifier. Saturation-to-average ratio is the sum of the backoff and the saturation-to-1 dB compression point ratio. It indicates the maximum possible output PAPR. The threshold will determine when to switch between digital and analog amplification paths and accordingly, the range of input values that will be quantized. The number of bits used determines how fine the input signal "spikes" will be quantized. The combination of these factors impact performance of the hybrid PA. Note that the above tradeoffs are taken into account to achieve an optimal configuration for a particular implementation of the hybrid PA.

Figure 9:
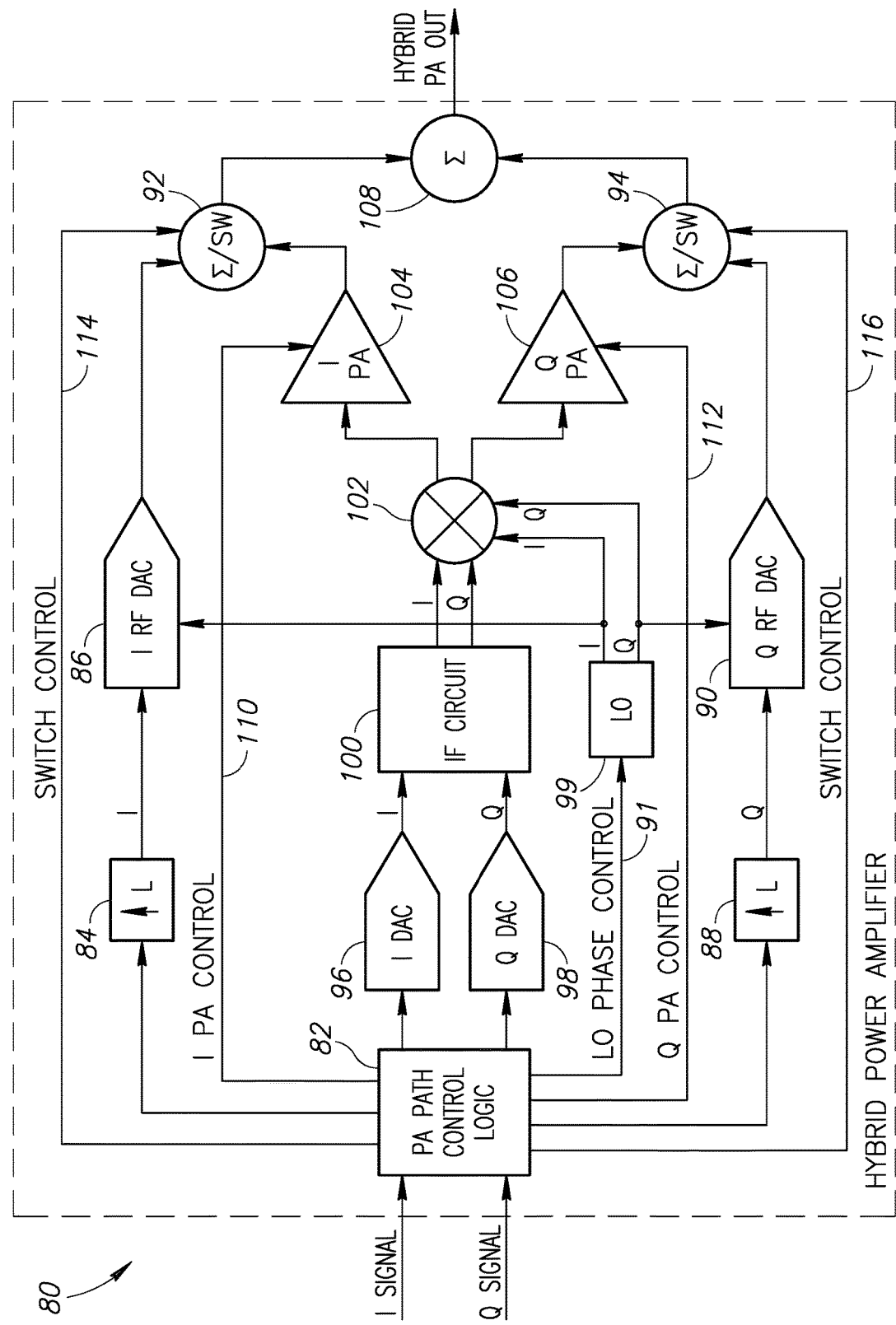
FIG. 9 is a schematic diagram illustrating a second example linear hybrid power amplifier circuit of the present invention.

A schematic diagram illustrating a second example linear hybrid power amplifier circuit of the present invention is shown in FIG. 9. In this example embodiment, the hybrid amplification circuit comprises two digital amplification paths and two analog amplification paths. The hybrid PA circuit, generally referenced 80, comprises a linear analog amplification path and a digital amplification path. The PA path control logic block 82 analyzes the input I signal and Q signal and determines which amplification path(s) to steer the input I and Q signals to. The linear amplification path comprises I digital to analog converter (DAC) 96, Q DAC 98, IF circuit 100, mixer 102, local oscillator (LO) 99, I analog linear power amplifier 104, and Q analog linear power amplifier 106. The I PA 104 is controlled via I PA control signal 110 from the PA path control circuit 82 while the Q PA 106 is controlled via Q PA control signal 112 from the PA path control circuit 82. LO phase control 91 is input to the LO 32 from the PA path control logic block 82.

The digital amplification path comprises I up-sampling circuit 84, Q up-sampling circuit 88, I RF DAC 86, Q RF DAC 90. Summer 92 functions to either add or select (i.e. switch) the output of the I RF DAC 86 and the I PA 104 in accordance with switch control signal 114 generated by the path control logic circuit 82. Similarly, summer 94 functions to either add or select (i.e. switch) the output of the Q RF DAC 90 and the Q PA 106 in accordance with switch control signal 116. The outputs of the summer/selectors 92, 94 are summed via summer 108 to generate the hybrid PA output signal.

The PA path control logic block 82 is operative to determine when to apply digital amplification, when to apply analog amplification, when to apply both digital and analog amplification and how to control the amplification process.

Note that in one embodiment, the hybrid amplification circuit may be implemented as circuitry located on a single integrated circuit or within the same device. Alternatively, the circuits may be implemented as any number of separate integrated circuits or separate devices interconnected with each other in a suitable manner.

In operation, the PA path control logic compares the I and Q signals to thresholds (which may or may not be different) and based on the comparisons, select one or more paths for the input I and Q signals. Whether the signals from the analog and digital amplification paths are to be combined or selected (i.e. switched), the PA path control circuit is operative to generate the select (switch) control signals 114 and 116 which are applied to summer/selectors 92, 94, respectively.

The operation of the IF circuit 100, mixer 102 are local oscillator 99 in the analog amplification path and the up-sampling circuit and RF DACs in the digital amplification path as well as the 2D digital predistortion are similar to the corresponding components in the hybrid PA circuit of FIG. 1 described supra.

In operation, the hybrid amplification circuit receives multiple input signals (e.g., I and Q signals). The input I and Q signals are compared to I and Q thresholds, respectively, and based thereon the circuit applies linear analog amplification on the I signal, the Q input signal, neither signal or both signals; and applies digital amplification on the I signal, Q signal, neither signal or both signals.

The analog amplification path is preferably optimized for low power levels while the digital amplification path is optimized for high power levels. This permits the hybrid amplification circuit to achieve a relatively very good error vector magnitude (EVM) floor and better efficiency along all range of power levels while requiring far fewer RF DAC components relative to a fully digital power amplifier. This results in substantially reduced complexity, robust EVM performance control, less area consumed by the RF DAC components while still providing flexibility and control.

Note that the EVM floor is optimized due to the linear performance of the analog amplification path at low power levels. The efficiency at low power levels (both average and instantaneous) is optimized since the analog power amplifier is configured for relatively low saturation power.

Similarly, the efficiency at high power levels (both average and instantaneous) is optimized due to the operation of RF power DACs in the digital amplification path which comprise power amplifiers which are operated selectively in accordance with the instantaneous digital word representing the required instantaneous power. This yields significantly higher efficiency and reduced power consumption.

With reference to FIG. 9, the path control logic 82 receives I and Q signals and determines an amplification scheme based upon one or more attributes of the I and Q signals. Note that a signal attribute may comprise the power level of a signal, an amplitude of a signal, a shape of an envelope of a signal, an absolute value of the power level of a signal, an absolute value of the amplitude of the signal, etc.

Several examples include: (1) the power level of the I signal is compared to a first threshold to determine how to amplify the I signal and/or the Q signal; (2) the power level of the Q signal is compared to a second threshold to determine how to amplify the I signal and/or the Q signal; and (3) a sum (or any other combination) of the power levels of the I and Q signals are compared to a third threshold to determine how to amplify the I and/or Q signals (i.e. which amplification paths to take for the I and Q signals).

A determination of how to amplify the I signal and/or the Q signal may include determining which path of the digital and analog amplification paths to use and determining amplification parameters such as gain, working point, etc.

Note that the first, second and third thresholds may be predetermined, dynamically adjusted or fixed. These thresholds may reflect the amplification characteristics of the different amplification paths. For example, these thresholds may be set in order to prevent the analog amplification path from amplifying signals that are strong enough to cause substantial distortions. In addition, the controller 82 may be configured to prevent too frequent switches between the analog and the digital amplification paths by the use of a hysteresis loop, for example.

In one embodiment, in order to determine the threshold value as well as optimum power amplifier parameters, the following inputs are needed: (1) the required linear output power, (2) the required EVM performance at the targeted output power level, (3) the required EVM floor, and (4) the required power added efficiency (PAE).

The example topology of FIG. 9 comprises two RF DACs and two linear PAs. There are three configuration options for this topology as defined below. Note that in all configurations, the Vth for I and Q signal may or may not be the same.

Configuration 1:

State 1: If I and Q baseband signals are below Vth, then both I and Q RF DACs 86, 90 are switched off and only linear PAs 104, 106 are active.

State 2: If both I and Q baseband signals are above Vth, then both I and Q RF DACs are switched on and both linear PAs are also active as well.

State 3: If the Q baseband signal is above Vth and the I baseband signal is below Vth, then the Q RF DAC 90 is switched on and the I RF DAC 86 is switched off and the linear PAs are active.

State 4: If the I baseband signal is above Vth and the Q baseband signal is below Vth, then the I RF DAC is switched on and the Q RF DAC is switched off and the linear PAs remain active.

Note that in this configuration, the linear Pas 104, 106 are always active. The second configuration is defined below.

Configuration 2:

State 1: If both I and Q baseband signals are below Vth, then both I and Q RF DACs are switched off and only the linear PAs are active.

State 2: If the I and Q baseband signals are above Vth, then both I and Q RF DACs are switched on; both linear PAs are switched off and RF summer/selectors 92, 94 are configured to output signals from RF DAC PAs 86, 90 to RF summer 108 which generates the hybrid PA output signal.

State 3: If the Q baseband signal is above Vth and the I baseband signal is below Vth, then the Q RF DAC is switched on and the I RF DAC is switched off and the linear PAs remain active.

State 4: If the I baseband signal is above Vth and the Q baseband signal is below Vth, then the I RF DAC is switched on and the Q RF DAC is switched off and linear PAs remain active.

The third configuration is defined below.

Configuration 3:

State 1: If both I and Q baseband signals are below Vth, then both I and Q RF DACs 86, 90 are switched off and only linear PAs 104, 106 are active.

State 2: If both I and Q baseband signals are above Vth, then both I and Q RF DACs are switched on, all linear PAs are switched off and RF summer/selectors 92, 94 are configured to output signals from RF DACs 86, 90 to the RF summer 108 which generates the hybrid PA output signal.

State 3: If the Q baseband signal is above Vth and the I baseband signal is below Vth, then the Q RF DAC is switched on and the I RF DAC is switched off, linear Q PA 106 is off, but linear I PA 104 is active and RF switches 92 and 94 provide the signals from linear I PA 104 and Q RF DAC 90, respectively, to the RF summer 108.

State 4: If the I baseband signal is above Vth and the Q baseband signal is below Vth, then the I RF DAC 86 is switched on and the Q RF DAC 90 is switched off, linear I PA 104 is off but linear Q PA 106 is active and RF switches 92 and 94 provide the signals from I RF DAC 86 and linear Q PA 106, respectively, to the RF summer 108.

Figure 10:
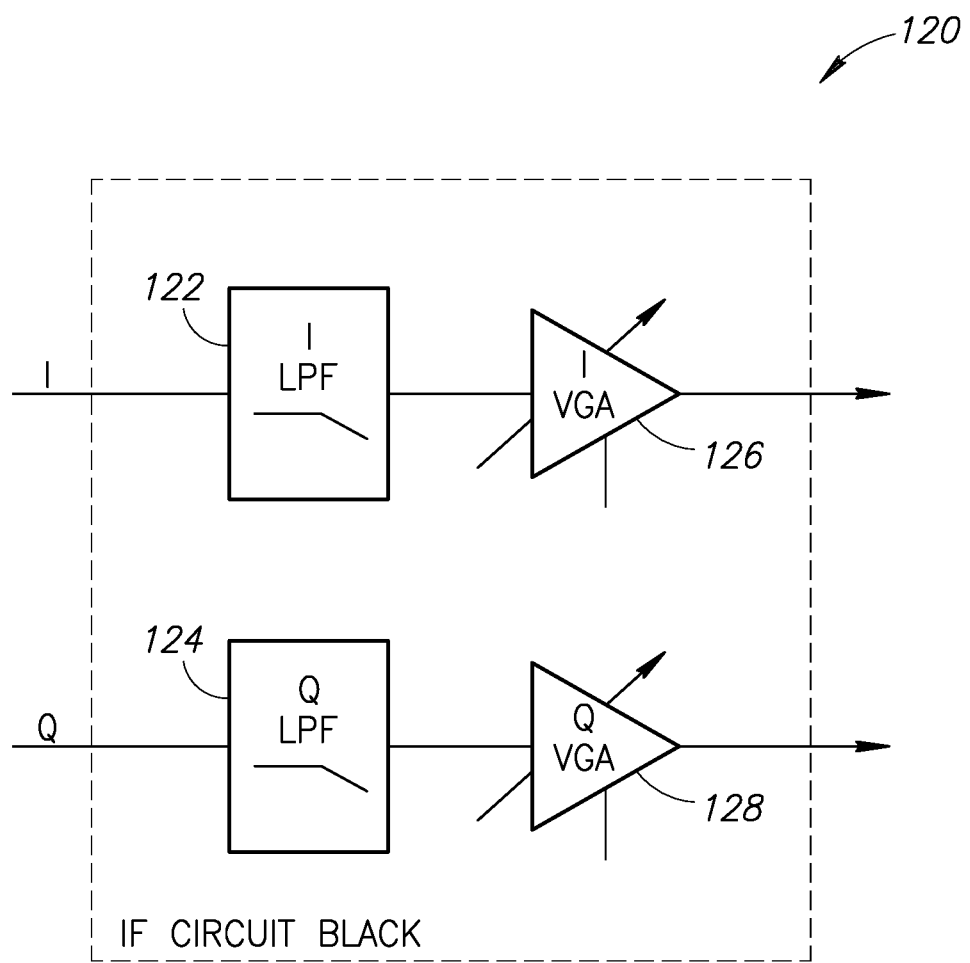
FIG. 10 is a block diagram illustrating the IF circuit block of FIG. 9 in more detail.

A block diagram illustrating the IF circuit block of FIG. 9 in more detail is shown in FIG. 10. The implementation of the IF block shown here is for illustration purposes only as one skilled in the art can implement the IF block in numerous other ways without departing from the scope of the invention. The IF block, generally referenced 120, comprises a low pass filter (LPF) 122 and variable gain amplifier (VGA) 126 for the I signal path, and a low pass filter 124 and variable gain amplifier 128 for the Q signal path.

Figure 11:
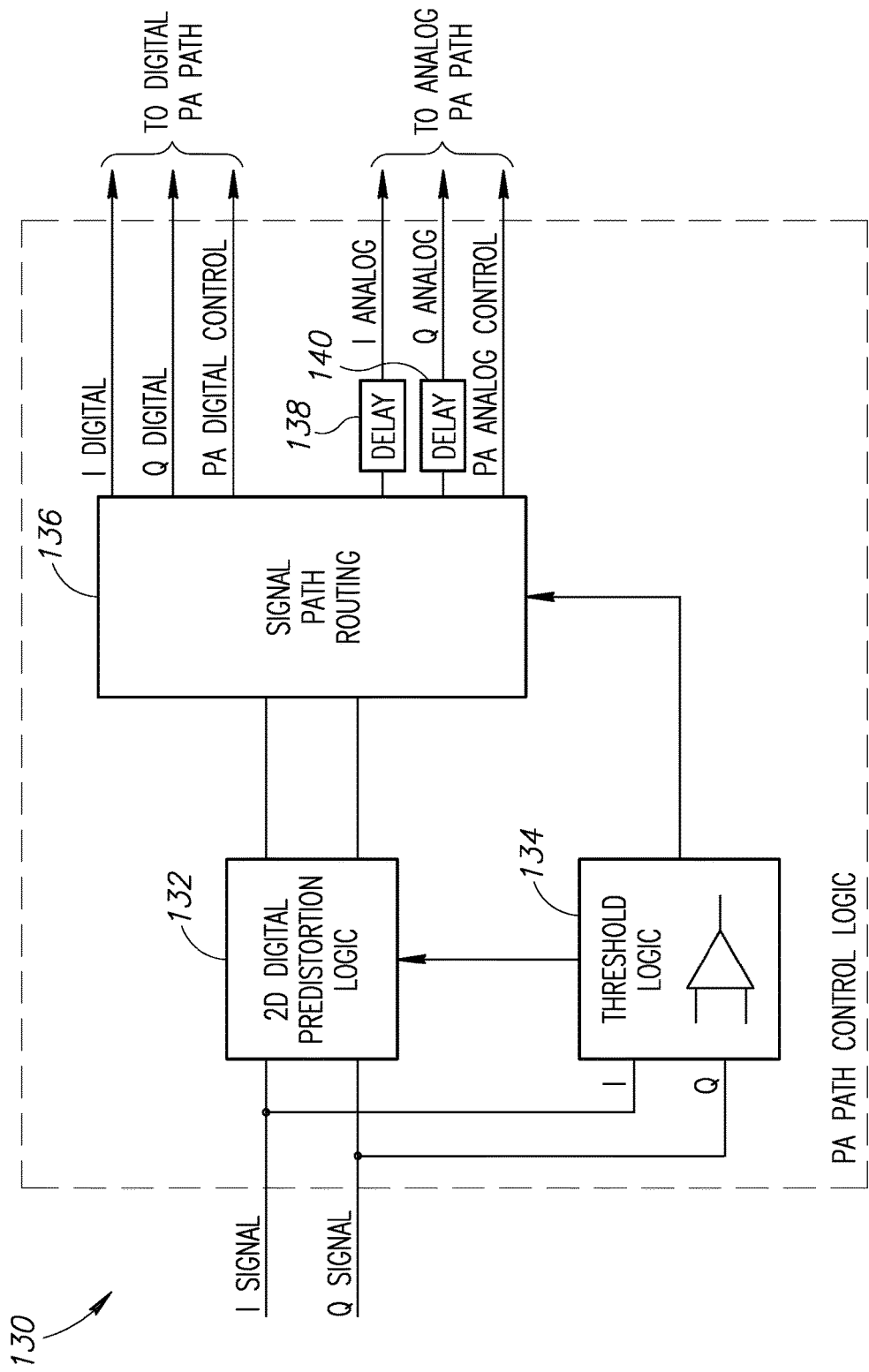
FIG. 11 is a block diagram illustrating the PA path control logic of FIGS. 1 and 9 in more detail.

A block diagram illustrating the PA path control logic of FIGS. 1 and 9 in more detail is shown in FIG. 11. In one embodiment, the path control logic, generally referenced 130, comprises a 2D predistortion logic block 132, threshold logic block 134, signal path routing block 136, and delay blocks 138, 140.

Figure 12:
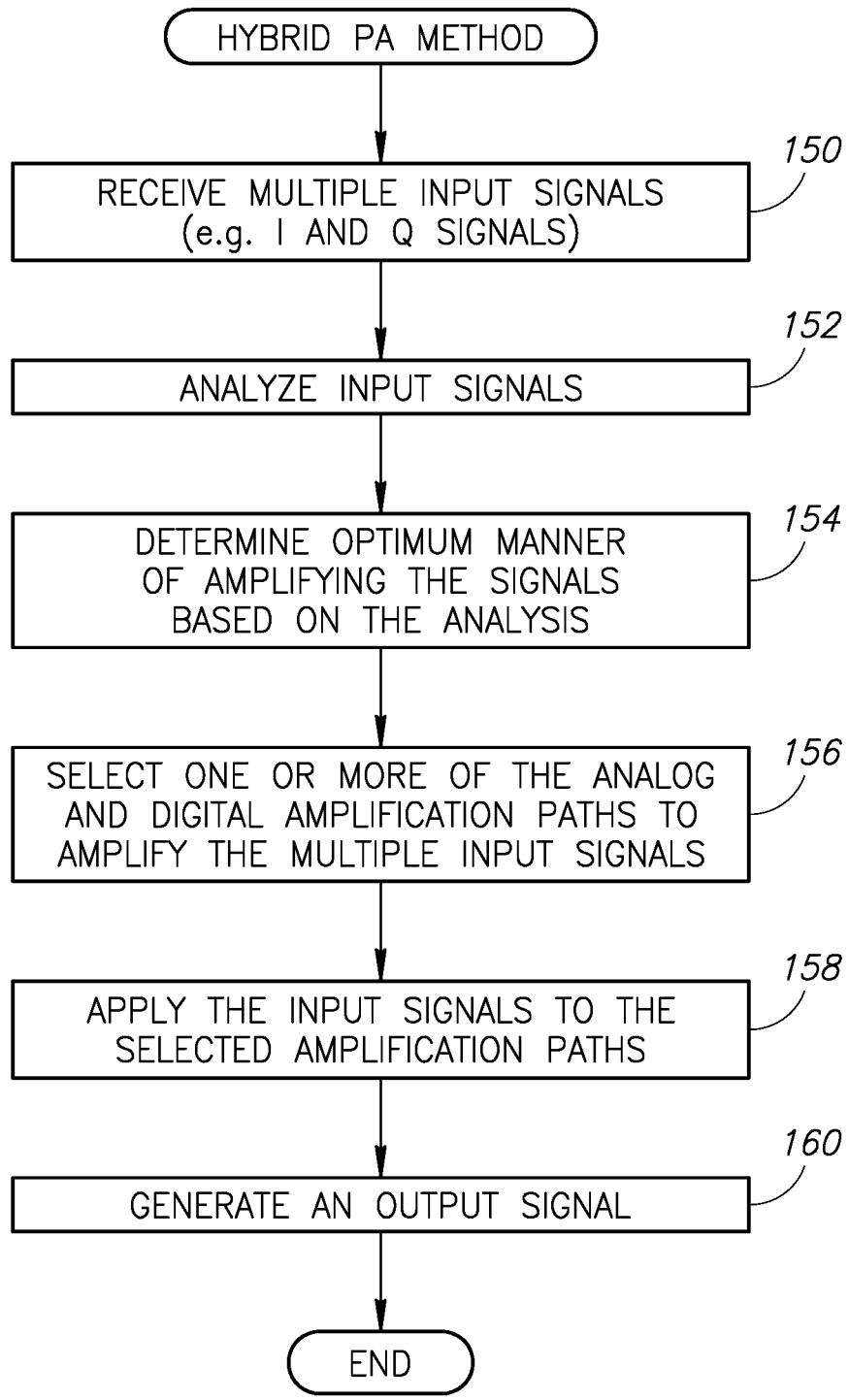
FIG. 12 is a flow diagram illustrating an example hybrid PA method of the present invention.

A flow diagram illustrating an example hybrid PA method of the present invention is shown in FIG. 12. In one embodiment, the method begins by receiving multiple input signals such as but not limited to I and Q signals (step 150). The one or more input signals are then analyzed (step 152). Then, based upon one or more attribute of the multiple input signals, the optimum manner of amplifying the signals is determined (step 154). One or more amplification paths (e.g., analog/digital for each of I and Q signals) are selected to amplify the multiple input signals (step 156). The amplification paths include a digital amplification path and an analog amplification path. The input signals are then applied to the selected amplification paths (step 158) and the output signal is generated thereby (step 160).

With reference to the examples of FIGS. 1 and 9, the multiple input signals comprise I and Q signals and the I and Q signals are amplified using one or more of the digital and analog amplification paths. If only one amplification path is selected, its output signal is provided as the output signal of the hybrid amplification circuit. If both amplification paths participate in the amplification, then their output signals are combined to yield the output signal of the hybrid amplification circuit.

Figure 13:
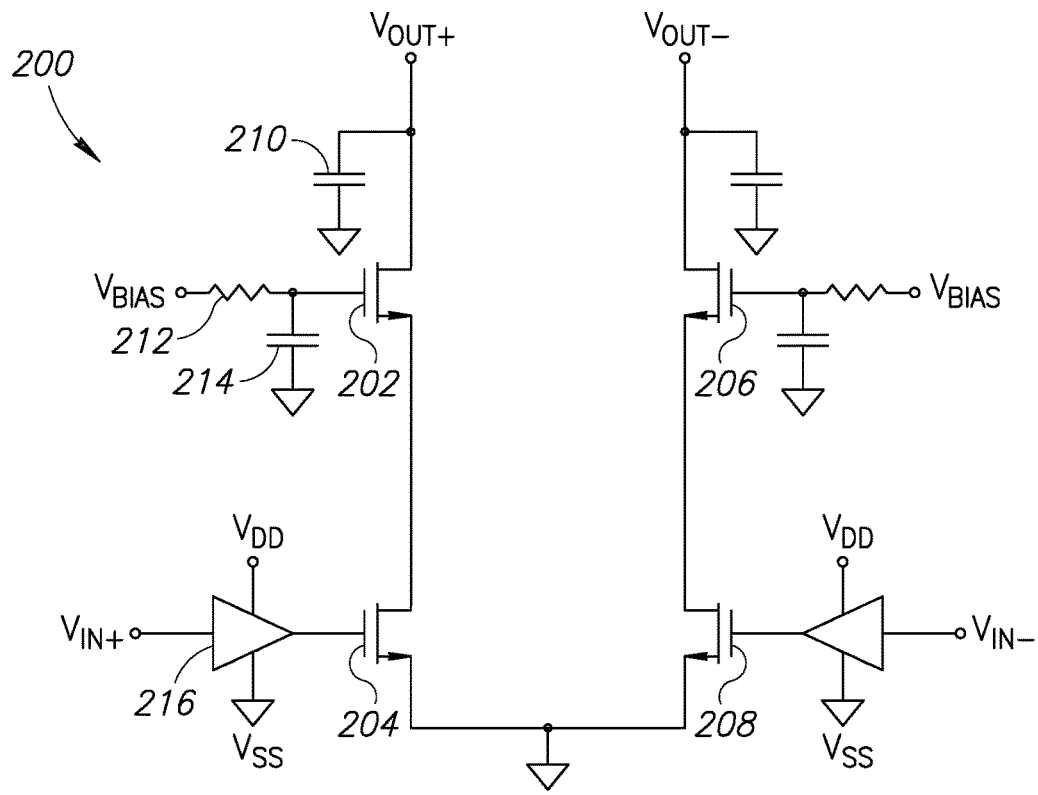
FIG. 13 is a schematic diagram illustrating an example digital PA (DPA) cell in more detail.

A schematic diagram illustrating an example digital PA (DPA) cell in more detail is shown in FIG. 13. The digital PA cell, generally referenced 200, comprises an upper pair of four transistors 202, 206 and a lower pair of transistors 204, 208 in a differential cascode configuration. The gate of each upper transistor is connected to a biasing voltage Vbias through a resistor 212 and to a capacitor 214 to ground. The differential input signal Vin+, Vin− is input to a digital buffer 216 whose output is connected to the gate terminal of the lower transistors. Note that the digital PA cell structure may comprise any suitable power amplifier design which generates high efficiency and digital control of output power. Note that the implementation of the digital PA (DPA) cell shown here is for illustration purposes only as one skilled in the art can implement the digital PA (DPA) cell in numerous other ways without departing from the scope of the invention.

Figure 14:
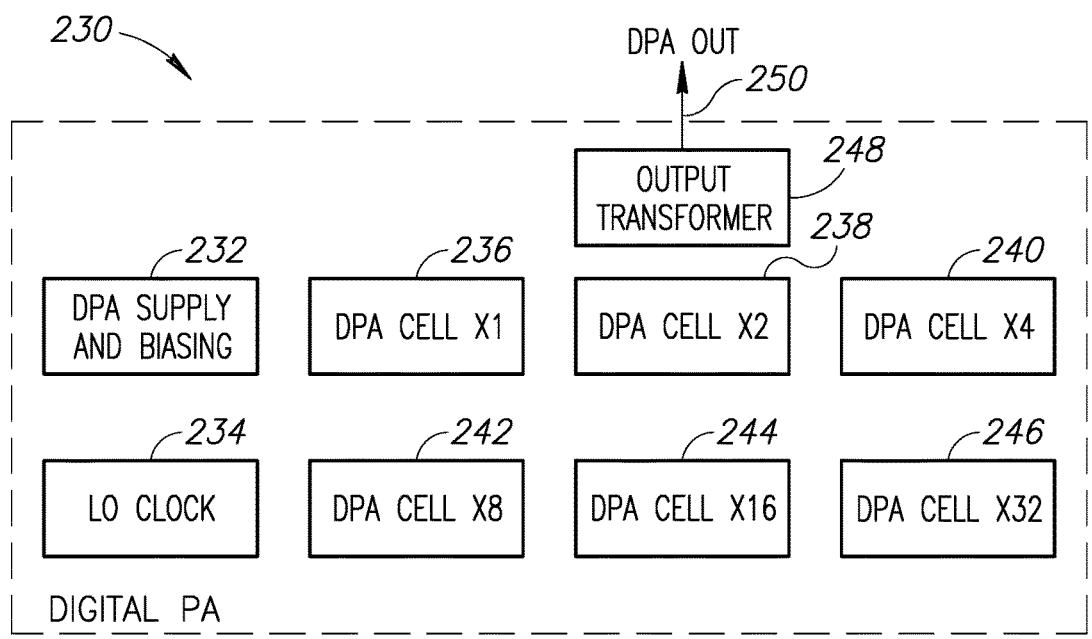
FIG. 14 is a schematic diagram illustrating an example digital PA (DPA) utilizing the DPA cell of FIG. 13.

A schematic diagram illustrating an example digital PA (DPA) utilizing the DPA cell of FIG. 13 is shown in FIG. 14. The digital PA, generally referenced 230, comprises a plurality of DPA cell structures arranged in a series of groups: DPA cell x1 block 236, DPA cell x2 block 238, DPA cell x4 block 240, DPA cell x8 block 242, DPA cell x16 block 244, and DPA cell x32 block 246. The digital PA also comprises DPA supply and biasing block 232 and LO clock block 234. The digital PA is configured to combine a plurality of digital power amplifier cells (FIG. 13) and provides control of output power in accordance with the amplitude of the input signal and its phase.

It is noted that as the number of bits used in the digital PA path increases, the complexity of the transceiver design including the 2D predistortion circuit also increases. Thus, it is preferable to select the smallest number of digital PA cells as possible in order to simplify the circuit topology and reduce transceiver interconnection losses. For a given scenario (i.e. frequency, output power, EVM, PAE, etc.) the optimal settings are preferably determined using a calibration process. In the case of dynamically changing scenarios, the relevant configuration can be selected accordingly.

Mobile Device Incorporating the Linear Hybrid PA

Figure 15:
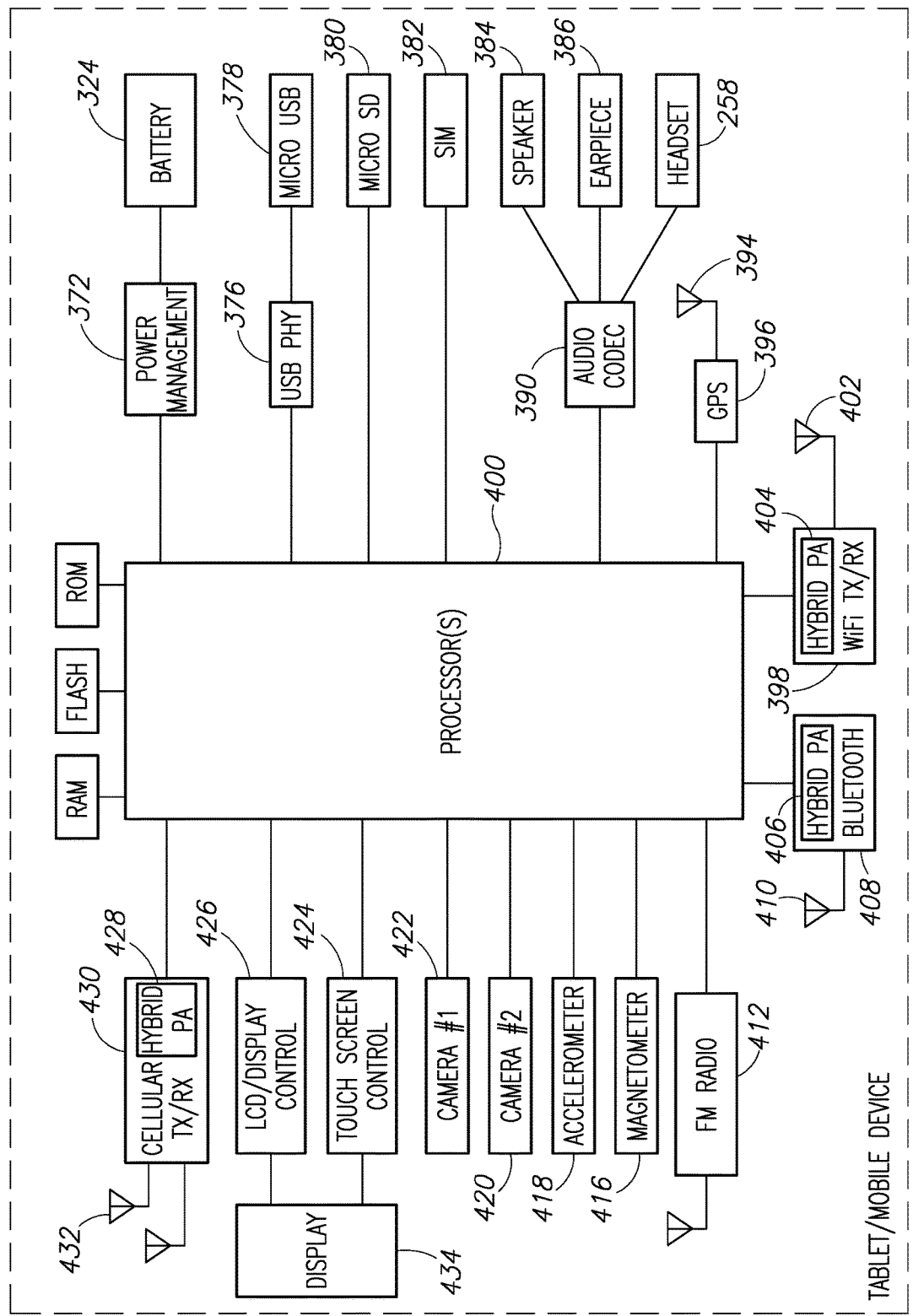
FIG. 15 is a block diagram illustrating an example mobile device incorporating the hybrid PA of the present invention.

A block diagram illustrating an example tablet/mobile device incorporating one or more transceivers that includes the linear hybrid PA of the present invention is shown in FIG. 15. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 comprises one or more hybrid PA circuits, each incorporating the hybrid PA circuit of the present invention. Numerous embodiments of the mobile device 370 may comprise a hybrid PA circuit 428 as described supra incorporated in the one or more cellular radios 430; a hybrid PA circuit 406 as described supra incorporated in the Bluetooth radio 408; and a hybrid PA circuit 404 as described supra incorporated in the Wi-Fi radio 398.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

We claim:

1. A hybrid power amplifier (PA) circuit, comprising: a first amplification path based on an analog linear amplifier and operative to receive and amplify an input signal; a second amplification path based on a digital power amplifier (DPA) circuit and operative to receive and amplify the input signal; a path control circuit operative to select at least one of said first amplification path and said second amplification path in response to said input signal; and a circuit operative to either combine or select an output of said first amplification path and said second amplification path to generate a linear hybrid PA output signal therefrom.

2. The hybrid power amplifier circuit according to claim 1, wherein said path control circuit is operative to select an amplification path based on at least one attribute of the input signal, wherein said attribute is selected from the group consisting of a power level of the input signal, an amplitude of the input signal, a shape of the input signal, an envelope of the input signal, an absolute value of a power level of the input signal and an absolute value of an amplitude of the input signal.

3. The hybrid power amplifier circuit according to claim 1, wherein said path control circuit is operative to compare a power level of an I portion of the input signal to a threshold.

4. The hybrid power amplifier circuit according to claim 1, wherein said path control circuit is operative to compare a power level of a Q portion of the input signal to a threshold.

5. The hybrid power amplifier circuit according to claim 1, wherein said path control circuit is operative to compare a sum of power levels of I and Q portions of the input signal to a threshold.

6. The hybrid power amplifier circuit according to claim 1, wherein said digital power amplifier (DPA) circuit comprises one or more RF digital to analog converters (DACs).

7. The hybrid power amplifier circuit according to claim 1, wherein said first amplification path comprises an intermediate frequency (IF) circuit, associated mixer and local oscillator and analog linear power amplifier circuit.

8. The hybrid power amplifier circuit according to claim 1, wherein said second amplification path comprises one or more up-sampling circuits.

9. The hybrid power amplifier circuit according to claim 1, wherein said path control circuit is operative to determine one or amplification parameters selected from the group consisting of gain, working point, backoff and threshold.

10. The hybrid power amplifier circuit according to claim 1, wherein said path control circuit comprises a 2D digital predistortion circuit operative to compensate for mismatches between I and Q branches and/or within each branch.

11. A hybrid power amplifier (PA) circuit, comprising: a first amplification path based on an analog linear amplifier and operative to receive and amplify an input I signal; a second amplification path based on an analog linear amplifier and operative to receive and amplify an input Q signal; a third amplification path based on a digital power amplifier (DPA) and operative to receive and amplify the input I signal; a fourth amplification path based on a digital power amplifier (DPA) and operative to receive and amplify the input Q signal; a path control circuit operative to select at least one of said first amplification path and said second amplification path for the input I signal, and to select at least one of said third amplification path and said fourth amplification path for the input Q signal; a first circuit operative to either combine or select an output of said first amplification path with an output of said second amplification path; a second circuit operative to either combine or select an output of said third amplification path with an output of said fourth amplification path; and a third circuit operative to combine outputs from said first circuit and said second circuit to generate a hybrid PA output signal therefrom.

12. The hybrid power amplifier circuit according to claim 11, wherein said path control circuit is operative to compare said I input signal to a threshold in determining its selection of at least one of said first amplification path and said second amplification path and/or its selection of at least one of said third amplification path and said fourth amplification path.

13. The hybrid power amplifier circuit according to claim 11, wherein said path control circuit is operative to compare said Q input signal to a threshold in determining its selection of at least one of said first amplification path and said second amplification path and/or its selection of at least one of said third amplification path and said fourth amplification path.

14. The hybrid power amplifier circuit according to claim 11, wherein said path control circuit is operative to select an amplification path based on at least one attribute of the input signal, wherein said attribute is selected from the group consisting of a power level of the input signal, an amplitude of the input signal, a shape of the input signal, an envelope of the input signal, an absolute value of a power level of the input signal and an absolute value of an amplitude of the input signal.

15. The hybrid power amplifier circuit according to claim 11, wherein said path control circuit is operative to determine one or amplification parameters selected from the group consisting of gain, working point, backoff and threshold.

16. The hybrid power amplifier circuit according to claim 11, wherein said path control circuit comprises a 2D digital predistortion circuit operative to compensate for mismatches between I and Q branches and/or within each branch.

17. A method of amplifying an I and Q input signal, the method comprising: providing an I analog linear amplification path operative to receive and amplify an I portion of an input I and Q signal; providing an I digital power amplification (DPA) path operative to receive and amplify an I portion of the input I and Q signal; providing a Q analog linear amplification path operative to receive and amplify an I portion of an input I and Q signal; providing a Q digital power amplification (DPA) path operative to receive and amplify an I portion of an input I and Q signal; first comparing the input I signal to a first threshold; second comparing the input Q signal to a second threshold; selecting one or more of said I analog linear amplification, said I digital power amplification path, said Q analog linear amplification and said Q digital power amplification path in accordance with said first comparing and said second comparing; and combining and/or selecting outputs of said I analog linear amplification, said I digital power amplification path, said Q analog linear amplification and said Q digital power amplification path in accordance with said first comparing and said second comparing to generate a hybrid power amplifier (PA) output signal therefrom.

18. The method according to claim 17, wherein said selecting comprises selecting an amplification path based on at least one attribute of the input signal, wherein said attribute is selected from the group consisting of a power level of the input signal, an amplitude of the input signal, a shape of the input signal, an envelope of the input signal, an absolute value of a power level of the input signal and an absolute value of an amplitude of the input signal.

19. The method according to claim 17, wherein said selecting comprises determining one or amplification parameters selected from the group consisting of gain, working point, backoff and threshold.

20. The method according to claim 17, wherein said I and Q analog linear amplification paths comprise an intermediate frequency (IF) circuit, associated mixer and local oscillator and linear power amplifier circuit.

21. The method according to claim 17, wherein said I and Q digital power amplification paths comprise one or more up-sampling circuits and one or more RF digital to analog converters (DACs).

22. The method according to claim 17, further comprising compensating for mismatches between I and Q branches and/or within each branch utilizing a 2D digital predistortion circuit.

* * * * *